United States Patent [19]

Bowhers et al.

[11] Patent Number: 4,792,932

[45] Date of Patent: Dec. 20, 1988

[54] TIME MEASUREMENT IN AUTOMATIC TEST EQUIPMENT

[75] Inventors: William J. Bowhers, Wayland, Mass.; Michael R. Ferland, Nashua, N.H.

[73] Assignee: Teradyne, Inc., Boston, Mass.

[21] Appl. No.: 3,951

[22] Filed: Jan. 16, 1987

[51] Int. Cl.[4] .......................... G04F 8/00; G01R 23/02
[52] U.S. Cl. .................................... 368/113; 324/78 F
[58] Field of Search ........................ 368/107, 113–118; 324/78 R, 78 F, 83 R, 83 A, 83 D

[56] References Cited

U.S. PATENT DOCUMENTS 4,362,394 12/1982 Menlove ............................. 368/118
4,492,918 1/1983 Hernandez et al. ............... 324/83 R
4,640,134 2/1987 Simmons ........................... 324/78 F

OTHER PUBLICATIONS

M 606 Users Manual, Section, Jun. 1985, Texradyne Inc.

Hewlett Packard, Time Interval Calibrator, Technical Data, Mar. 1986.

Primary Examiner—Vit W. Miska

[57] ABSTRACT

Apparatus for automatically testing electronic circuits and performing time measurements, including a time measuring circuit for counting clock pulses provided between stop and start event edges presented to it, two independent input selectors for each selectively connecting one of a plurality of its inputs to the time measuring circuit, and a plurality of local comparators located within the test apparatus near sources of signals to be timed and generating an event edge upon receiving a signal crossing a threshold value. Also disclosed are making time measurements of signals at digital and analog pins using local comparators connected to input selectors over deskewed transmission paths and connecting a local comparator to the filter output of an analog instrument.

21 Claims, 3 Drawing Sheets

TIME MEASUREMENT IN AUTOMATIC TEST EQUIPMENT

FIELD OF THE INVENTION

The invention relates to measuring time in apparatus for automatically testing electronic circuits.

BACKGROUND OF THE INVENTION

In apparatus for testing electronic circuits, input test signals are generated and provided to a fixture engaging the circuit under test ("CUT"), and resulting output signals are compared with expected results. The test signals and the resulting outputs can be digital, analog (e.g., audio or vdeo) or a combination of digital and analog (e.g., for a codec or modem).

Such test apparatus typically includes time measuring circuits to measure such things as rise time, pulse width, propagation delay, frequency, duty cycle and ratios of repetitive events with respect to signals at the nodes of the CUT. Typically a single time measuring circuit, including comparators that receive the signal or signals being timed and provide event edges to a timer/counter, is employed and is selectively connected to receive an analog signal or signals to be timed. A timer/counter typically counts clock pulses between start and stop events (i.e., the signal of interest crossing a designated threshodd at which the comparator provides an event edge), and two counters can be used so that one can count clock pulses while the other counts events. When timing digital signals at digital nodes of the CUT, the comparators of the digital detectors provide the event edges that are selectively routed by switching to the time measuring circuit.

In a prior art circuit tester available from Teradyne Inc. under the trade designation M606, a general time measuring circuit was provided in the mainframe, and a pair of timing comparators were located in an adjacent test table and connected to input/output plugs to which the user electrically connected his fixture for the CUT and any local pin electronics, e.g., switching and special instruments. Connecting the two timing comparators to more than two pins required switching by the user in his local pin electronics. Digital detectors were in subsystems for two testing stations that also were separate from the mainframe. The time measuring circuit could be connected through an input switch in the mainframe to either the two comparators dedicated to timing or to two comparators of the digital detectors in one of the two testing station subsystems.

SUMMARY OF THE INVENTION

In general, in one aspect the invention features making accurate time measurements of signals in automatic circuit testing apparatus by providing local timing comparators that are located near sources of signals to be timed, are dedicated to timing, and are connected to two independent input selectors of a time measuring circuit by transmission paths. The local comparators each provide an event edge that is independent of the signal to be timed and has the same characteristic as edges from other comparators upon sensing that the signal to be timed crosses a programmable threshold, adjusted to the event of the particular signal to be timed. One input selector can provide a start counting event, and the other can provide a stop counting event; by using two independent input selectors, greater flexibility and capabilities are provided, as one can select which of a plurality of timing comparators located near sources is to detect a start event and which is to detect a stop event. Also, the switching provided by the input selectors is of event edges, and not the actual analog signal being timed, and thus does not affect the signal being timed or the detection of its threshold.

In preferred embodiments the transmission paths are differential ECL shielded twisted pairs; there are two pairs of local timing comparators dedicated solely to measuring time on two channel cards in a test head including a fixture with node contacts contacting leads of the CUT; the local comparators are connected to circuit node contacts by controlled impedance paths to avoid reflections; each local timing comparator has an associated contact node connected to it over a short path to reduce capacitance; there is a controlled impedance two-line switching matrix making outputs of analog node contacts other than those associated with the timing comparators connectable to timing comparators; and the input selectors employ, for each input, a pair of differential amplifier elements that are provided by the same integrated circuit chip, have outputs that are aligned with each other in two rows along an output bus, and are simply powered on to connect an input to the selector.

In another aspect the invention features making digital detector comparators connectable to inputs to two independent input selectors also having inputs connected to local timing comparators (i.e., dedicated to time measuring), and the transmission paths are deskewed to permit an edge from a digital detector comparator and an edge from a timing comparator to be used to initiate and end timing.

In another aspect the invention features connecting a local timing comparator to the output of a filter in an analog processing instrument including an analog to digital converter, thereby reducing noise in the signal to the local timing comparator, and reducing the number of measurements needed to be averaged. In preferred embodiments there are high and low frequency analog signal processing instruments and separate timing comparators connected to the filter outputs in each.

Other features and advantages of the invention will be apparent from the following description of a preferred embodiment thereof and from the claims.

DESCRIPTION OF THE PREFERRED EMBODIMENT

The preferred embodiment will now be described.

DRAWINGS

FIG. 2 is a diagram of wiring of integrated circuit chips of the FIG. 2 input selector.

STRUCTURE

Figure 1:
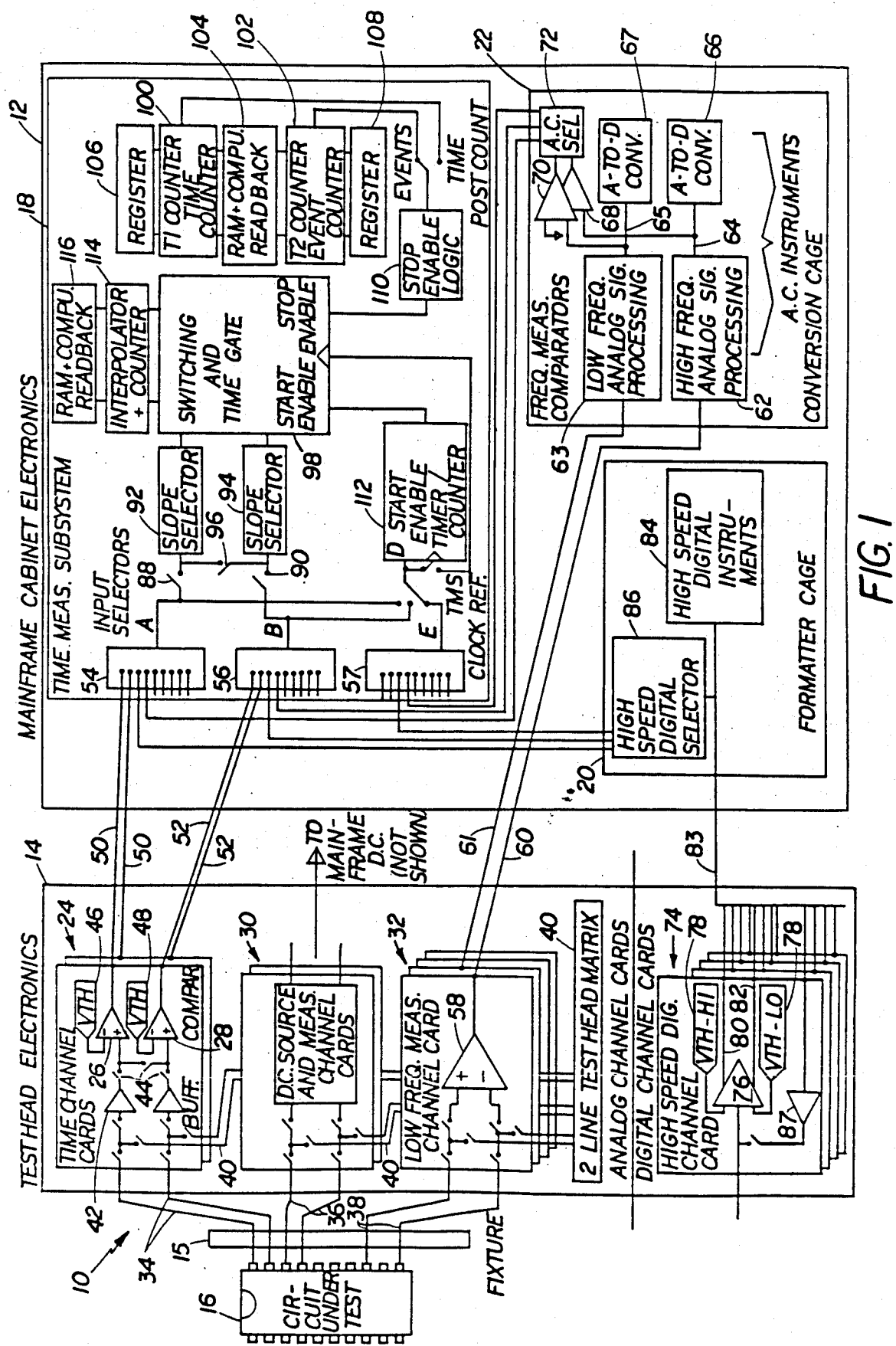
FIG. 1 is a lock diagram of elements of electronic circuit testing apparatus relating to time measurement functions.

In FIG. 1 the elements of electronic circuit tester 10 relating to time measurements are shown. They include mainframe cabinet electronics 12 and test head electronics 14. The test head electronics are located in a test head that includes a plurality of daughter channel cards carrying portions of digital and analog instruments which are electrically connected over short distance, controlled impedance paths to fixture 15 connected to circuit under test ("CUT") 16.

Included in mainframe cabinet electronics 12 is the time measuring subsystem 18, which is used to measure time between events and to count events within a specified period of time, for example, to measure such things as rise time, pulse width, propagation delay, frequency, duty cycle, and ratios of repetitive events with respect to signals at the nodes of CUT 16. Also included in main frame electronics 12 is formatter cage 20, for providing input digital test signals to and for receiving and processing the output digital signals from CUT 16, and conversion cage 22, for providing input analog test signals to and for processing output analog signals from CUT 16.

Test head electronics 14 includes two analog time channel cards 24 each carrying local timing comparators 26, 28 (687 type, differential ECL) dedicated to making time measurements. Test head electronics 14 also includes analog direct current source and measure channel cards 30 and analog alternating current source and measure channel cards 32 (also referred to as conversion cards for both low frequency and high frequency), for providing and capturing analog signals, e.g., direct current, high accuracy direct current, low frequency alternating current, and high frequency alternating current. Each analog channel card 24, 30 or 32 is connectable to two nodes of CUT 16 over controlled impedance paths 34, 36, 38, which include (see FIG. 1A) connections through pogo pins on interface board 39 (which is perpendicular to the channel cards), device card 41 (which is parallel to and connected to the interface board by pogo pins), and test fixture 15, supported on device card 41. Each path 34, 36, or 38 can be directly connected to the components on its respective channel card (providing the shortest, primarily uninterrupted path for transmission of a signal for best accuracy) or can be connected via two-line, controlled impedance switching matrix 40 to components on any other analog channel card.

Time channel card 24 includes high impedance buffers 42, which also have high fidelity, and high speed, and minimize the loading of the nodes of CUT 16. Each buffer 42 is connectable via switches 44 to one or both (e.g., for a single channel measurement) of local timing comparators 26, 28. The other inputs of comparators 26, 28 are connected to respective programmable threshold voltage generators 46, 48. The outputs of comparators 26, 28 are connected via shielded, twisted pair lines 50, 52 to A, B input selectors 54, 56. A third E input selector 57 is connected to receive inputs from formatter cage 20 and conversion cage 22, also over shielded, twisted pair, differential ECL lines. Conversion cards 32 include differential amplifiers 58 connected by coaxial cables 60, 61 to high frequency and low frequency analog signal processors 62, 63 (including antialiasing and band-limiting filters). The outputs of signal processing 62, 63 are connected via lines 64, 65 to A/D converters 66, 67. Conversion cage 22 also includes high and low frequency local timing comparators 68, 70 with threshold inputs connected to ground to detect zero crossings. The outputs of comparators 68, 70 are selectively connectable to the inputs of selectors 54, 56, 57 via alternating current differential ECL channel selector 72.

Test head electronics 14 also includes a plurality of digital channel cards 74, for providing the high-speed digital test signals to digital pins of CUT 16 and detecting the output digital signals. Digital channel card 74 includes high impedance buffer 75 and dual threshold digital comparator 76, having programmable voltage threshold generators 78 and differential ECL output lines 80, 82 connected over bus 83 to both the high-speed digital comparison circuitry 84 (to process output digital signals and to compare them with expected results) and differential ECL high speed digital channel selector 86. Card 74 also includes high speed digital driver 87.

A, B, E input selectors 54, 56, 57 are each 16 to 1 differential ECL multiplexers described in more detail in FIG. 2 and the associated text below. Of the 16 inputs on each selector 54 or 56, six are for timing comparators 26, 28 (two per test head, up to three test heads), four are for high speed digital comparators 76, one is for one of frequency timing comparators 68 or 70, one is for checking purposes, and four are for additonal comparators that could be added in the future.

The outputs of the A and B input selectors 54, 56 are connected via switches 88, 90 to slope selectors 92, 94, to provide the desired slope to edges passing through them. The inputs of slope selectors 92, 94 are connectable to each other by single threshold connector 96, used to make single-threshold, single-channel measurements, for example, frequency. The outputs of slope selectors 92, 94 are connected to switching and time gate circuitry 98, which provides gated clock pulses and event pulses to counters 100, 102 (24-bit counters). The outputs of counters 100, 102 are provided to RAM and computer readback circuitry 104 for storing desired timing information. Registers 106, 108 are used to preload counters 100, 102, respectively, to perform postcount functions with stop enable logic 110. Start enable timer/counter 112 is connected to receive inputs from E input selector 57 or A or B input selectors 54, 56 to provide a start enable pulse after a designated event or time or combination of the two. Switching and time gate circuitry 98 also provides pulses to interpolator counter circuitry 114, used to determine the time between an event that is asynchronous with a clock edge and a clock edge, to provide measurement resolution better than that of the reference clock. The output of interpolation counter circuitry 114 is provided to RAM in computer readback 116 and used with the output from counters 100, 102.

Figure 2:
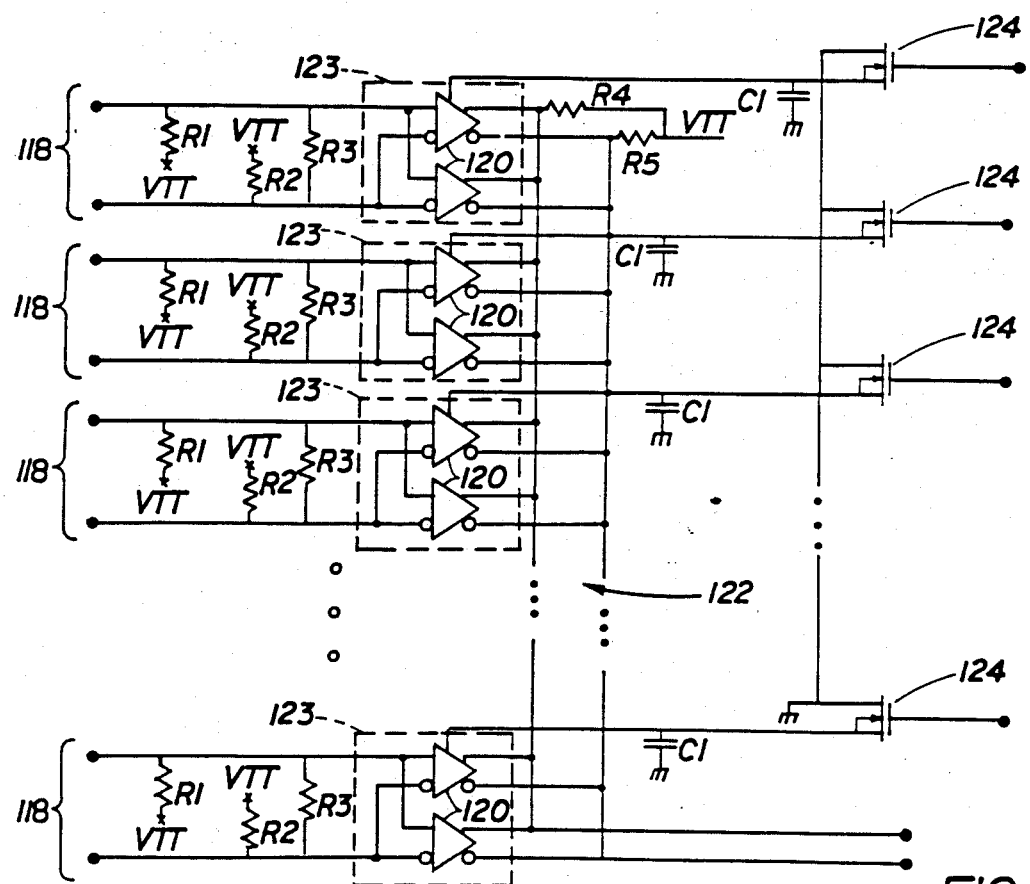
FIG. 2 is an electrical schematic of an input selector of the FIG. 1 apparatus.
Figure 2A:
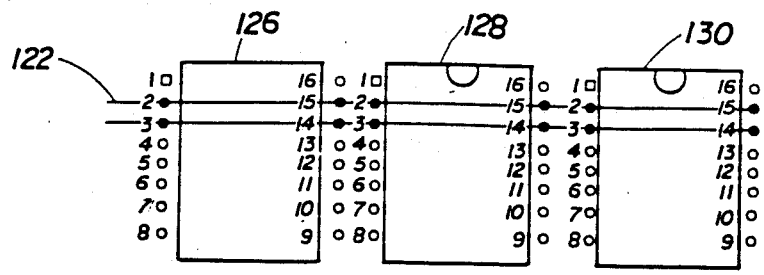

Referring to FIG. 2, there is shown a partial schematic for one half (eight inputs) of input selector 54. Input selectors 56, 57 are identical. Eight differential ECL inputs 118 are connected in parallel to pairs of differential amplifier elements 120 (10216) on the same integrated circuit chips, the outputs of which are connected to differential output bus 122. Each pair of amplifier elements 120 makes up a differential amplifier 123 with increased power. Inputs 118 are connected to terminating resistors R1 (75 ohms), R2 (75 ohms), and R3 (470 ohms). Bus 122 includes termination resistors R4 and R5 (68 ohms). Each pair of differential amplifier elements 120 are powered on and off by transistor 124 (VMOS FET, available from Supertex under designation VNO106). Capacitor C1 (0.1 uF) is used to bypass the differential amplifier's power supply. As can be seen in FIG. 2A, the output pins (2, 3, 15, 14) of the pairs of differential amplifiers 120 are in two rows, and adjacent integrated circuits 126, 128, 130 are aligned so that output bus 122, provided by conductors on a circuit board, is straight. This permits a high-quality transmission line output and high density of integrated circuits. FETs 124 are driven by a very low power control signal.

OPERATION

In general, in a typical time measurement, when signals to be timed cross thresholds, start and stop event edges are provided by local timing comparators and presented through input selectors 54, 56 to switching and time gate circuitry 98, and time counter 100 counts clock pulses between the two event edges. Event counter 102 optionally counts events during the time between the start and stop event edges, if desired.

The nodes of the CUT 16 having signals to be timed are either connected directly over paths 34 to comparators 26, 28 or over paths 36, 38 and two-line switching matrix 40. The path from the node of CUT 16 to the local timing comparator is of controlled impedance (to avoid reflections), and the path length is short (to provide reduced capacitance and load), thereby providing minimal distortion to the signal presented to the local comparators, and thus accurate triggering on the threshold events. When the signal presented to a local timing comparator 26 or 28 crosses a threshold, an ECL differential edge travels down the respective shielded, twisted pair 50 or 52 to the respective input selector 54 or 56. Because transmission paths 50, 52 are differential, they are immune to signal transmission distortions related to single-ended paths, for example noise and temperature. The shielding of these paths gives them controlled impedance, also helping in reducing distortion.

Referring to the schematic for the input selectors on FIG. 2, a differential input 118 is connected to the differential output bus 122 when a pair of differential amplifier elements 120 is powered on by the associated transistor 124 Termination resistors R1 through R3 match the impedance in the input lines to that of transmission paths 50, 52. Termination resistors R4, R5 match the impedance of the output bus on the printed circuit board. Referring again to FIG. 1, slope selectors 92, 94 select the desired start and stop slopes When timing periodic signal inputs, start enable timer counter 112 is used to select which of a plurality of these events is used to start the counting. Likewise stop enable logic 110 is used to determine which event of a plurality is used as a stop event.

When the timing measurement involves one or more digital signals detected by comparators 76 on the digital channel cards, high-speed digital channel selector 86 presents one or two of the event edges on lines 80, 82 (each digital pin has an associated digital comparator 76 and two lines 80, 82) to one or two of input selectors 54, 56, 57.

When doing analog signal frequency or period measurements, the output from differential amplifier 58 is filtered by the respective analog signal processing 62 or 63, and the output from the filtering is used as the input to the respective comparator 68 or 70. Selector 72 selectively provides the edge to one of the input selectors 54, 56, 57.

Different transmission paths through the various comparators to the switching and gate circuitry are deskewed by providing the same input through an equal-delay branched network and comparing the times that the signals arrive at the time measuring circuit. The compared values are then automatically used in the software to adjust for differences in delay. This deskewing permits an event edge from any local comparator 26, 28, 68, 70, or 76 to be used with an event edge from any other local comparator.

By having four local timing comparators in the test head near the circuit under test, precision timing measurements, employing a limited number of relays in the critical path between the node of the circuit under test and the comparator, of four pins can be made. In effect switching to select different signals for timing is done at differential ECL input selectors 54, 56, and this differential ECL signal distribution has a much better time performance than an analog distribution system could achieve. Where switching is necessary to connect local comparators 26, 28 to different pins of circuit under test 16 (i.e., those not connected to lines 34), it is done through controlled impedance two-line matrix 40.

Figure 3:
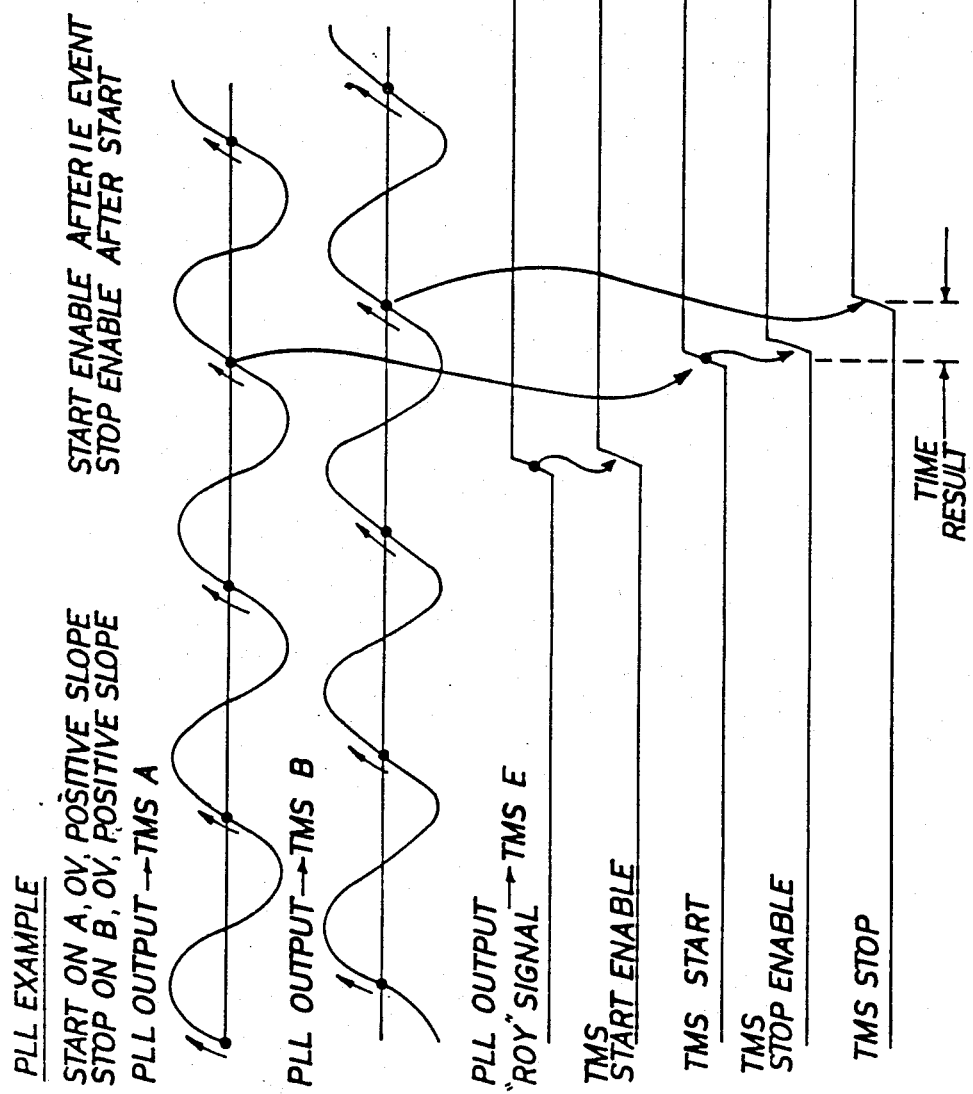
FIG. 3 is a time diagram describing a frequency measurement using the FIG. 1 apparatus.
Figure 1A:
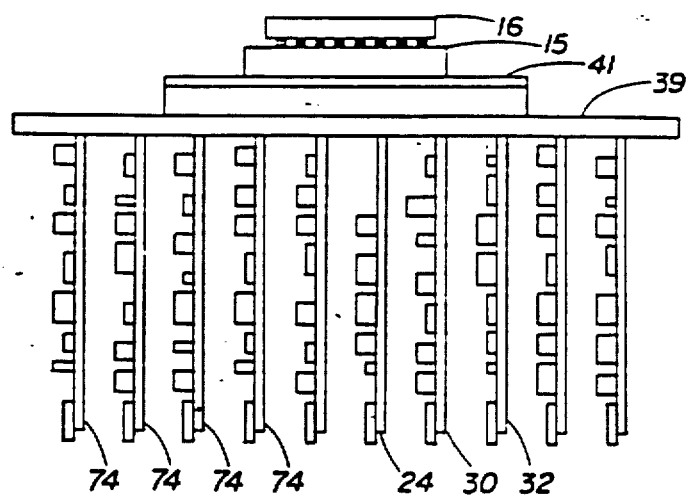
Figure 2:
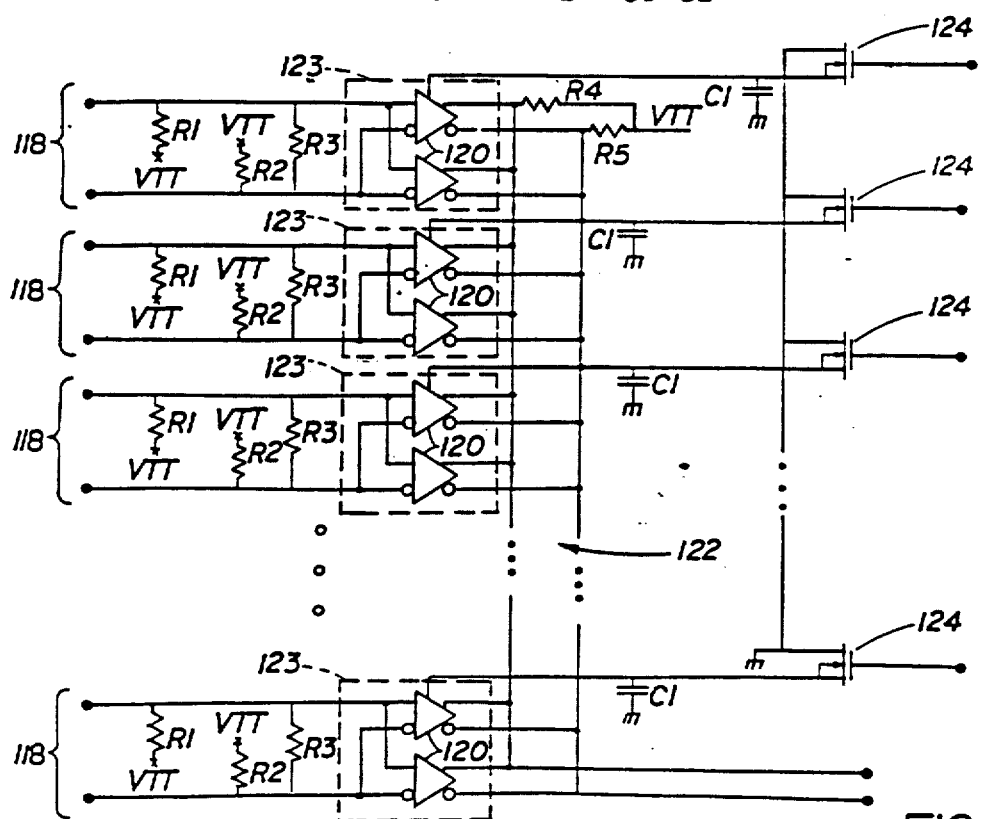
Figure 2A:
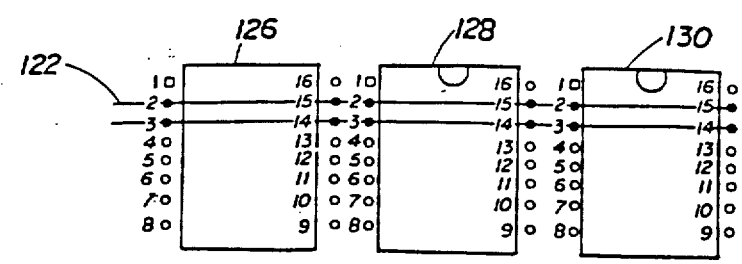

FIG. 3 is a timing diagram for an example of a timing measurement when the CUT is a phase locked loop integrated circuit, and it is desired to test the phase difference between the input and output alternating current signals, after the CUT has signalled its ready condition, indicating that the loop has locked. The analog input of CUT 16 is connected to the low frequency source card, and the analog output signal is connected to the low frequency measure card. The two-line matrix 40 would have its switches closed so as to present the input signal to one of the local timing comparators 26, 28 and the output signal to the other. Input selectors 54, 56 are switched to present the event edges from comparators 26, 28 through slope selectors 92, 94 to switching and time gate circuitry 98. A digital ready pin of CUT 16 is connected through a digital comparator 76, and the desired output line 80 or 82 is routed through high-speed digital input selector 86 to E input selector 57, to provide the start enable signal to switching and time gate circuitry 98. When a digital ready output is detected by digital comparator 76, a start enable signal is presented to switching and time gate circuitry 98. When the analog input signal next crosses its respective threshold in the desired direction, the start event edge is provided to the counters, and counter 100 begins counting clock pulses. When the next threshold of the output waveform is crossed in the desired direction, the stop event edge is provided, and counter 100 stops counting. The clock pulses counted between these two events gives the difference in phase.

OTHER EMBODIMENTS

Other embodiments of the invention are within the scope of the following claims. For example, additional analog channel cards with additional local timing comparators can be provided and connected to the circuit under test, and their outputs can be connected by differential ECL transmission to input selectors 54, 56, 57.

What is claimed is:

1. Apparatus for automatically testing electronic circuits and performing time measurements, said apparatus comprising
   a fixture including node contacts contacting nodes of a circuit under test,
   means for generating input test signals and providing them to said node contacts,
   means for detecting and processing output signals from said node contacts,
   a clock providing clock pulses, a time measuring circuit for counting clock pulses provided between two event edges presented to it, two independent input selectors each for selectively connecting one of a plurality of its inputs to said time measuring circuit and to transmit event edges provided at said inputs to said time measuring circuit, said time measuring circuit being able to use an event edge from either said independent selector as a start event edge or a stop event edge, a plurality of local timing comparators located within said test apparatus near sources of signals to be timed and generating one of said event edges when a said signal to be timed crosses a threshold value, said signals to be timed appearing at said node contacts, said comparators having thresholds that are programmable to adjust them to the event of the particular signal to be timed, transmission paths connecting said local timing comparators to respective said selector inputs, first and second said local comparators being connected to one said independent input selector, and a third said local comparator being connected to the other said independent input selector, said first, second, and third local comparators being dedicated solely to measuring time.

2. The apparatus of claim 1 wherein there is a fourth said local comparator connected to said other selector.

3. The apparatus of claim 2 wherein said local comparators are connected to said node contacts over controlled impedance paths.

4. The apparatus of claim 3 wherein said fixture and said local comparators are located in a test head including said fixture, a board supporting and electrically connected to said fixture, and channel cards perpendicular to, supporting and electrically connected to said board, said local comparators being located on said channel cards.

5. The apparatus of claim 1 further comprising a first alternating current measurement instrument including a first filter and a first analog to digital converter, and wherein said first comparator is connected to the output of said first filter.

6. The apparatus of claim 1 wherein there is a fourth said local comparator connected to a said input selector and wherein said first alternating current measurement instrument is high frequency, and further comprising a second low frequency alternating current measurement instrument including a second filter and a second analog to digital converter, and wherein said fourth local comparator is connected to the output of said second filter.

7. The apparatus of claim 2 wherein said event edges are differential ECL.

8. The apparatus of claim 7 wherein said transmission paths include shielded twisted pair lines to connect a said local comparator to said input selector.

9. The apparatus of claim 7 wherein said input selectors have differential ECL paths through them.

10. The apparatus of claim 9 wherein said input selectors employ, for each input, an independently powerable differential amplifier that is powered on to connect an input to the selector.

11. The apparatus of claim 10 wherein each said independently powerable differential amplifier comprises a pair of differential amplifiers that have common power control, are provided by the same integrated circuit chip and have outputs that are aligned with each other in two rows of chip leads along the sides of the integrated circuit chip, and plural integrated circuit chips in an input selector are aligned so that output lines to which said chip leads are connected are straight.

12. The apparatus of claim 11 wherein termination resistors are provided to input lines for the differential amplifiers to match the impedance of said transmission paths.

13. The apparatus of claim 1 wherein said time measuring circuit comprises a time counter, an event counter, and switching and time gate circuitry connecting said input selectors to said time counter and said event counter.

14. The apparatus of claim 13 wherein said time measuring cirucit comprises a precounter connected to said switching and gate circuitry to hold off a start of counting by said time counter or said event counter.

15. Apparatus for automatically testing electronic circuits and performing time measurements, said apparatus comprising a fixture including node contacts contacting nodes of a circuit under test, means for generating input test signals and providing them to said node contacts, means for detecting and processing output signals from said node contacts, a clock providing clock pulses, a time measuring circuit for counting clock pulses provided between two event edges presented to it, two independent input selectors each for selectively connecting one of its inputs to said time measuring circuit and to transmit event edges provided at said inputs to said time measuring circuit, said time measuring circuit being able to use event edge from either said independent selector as a start event edge or a stop event edge, a plurality of local comparators located within said test apparatus near sources of signals to be timed and generating one of said event edges when a said signal to be timed from a source crosses a threshold value, said signals being timed appearing at said node contacts, some said comparators being timing comparators dedicated solely to measuring time of signals at noes and some being digital comparators used to both detect digital output signals and to measure time, transmission paths connecting said local comparators to respective said input selector inputs, and means to deskew transmission paths from timing comparators and digital comparators, so that events at digital data nodes and other nodes can be timed in the same time measurement.

16. The apparatus of claim 15 wherein said event edges are differential ECL.

17. The apparatus of claim 16 wherein said transmission paths include shielded twisted pair lines to connect a said local comparator to said input selector.

18. The apparatus of claim 17 wherein said input selectors have differential ECL paths through them.

19. The apparatus of claim 16 wherein said local comparators are connected to said node contacts over controlled impedance paths.

20. Apparatus for automatically testing electronic circuits and performing time measurements, said apparatus comprising a fixture including node contacts contacting nodes of a circuit under test, means for generating input test signals and providing them to said node contacts,
means for detecting and processing output signals from said node contacts,
a clock providing clock pulses,
a time measuring circuit for counting clock pulses provided between two event edges presented to it,
a first alternating current measurement instrument including a first filter connected to receive an analog output signal from a said node contact of a circuit under test and a first analog to digital converter connected to receive the output of said first filter,
a first local timing comparator connected to said first filter to receive a filtered analog output signal and generate said event edge when the filtered signal crosses a threshold value, and
a first transmission path connecting said first local timing comparator to said time measuring circuit to transmit said event edge to said time measuring circuit.

21. The apparatus of claim 20 wherein said first alternating current measurement instrument is high frequency, and further comprising a second low frequency alternating current measurement instrument including a second filter and a second analog to digital converter, a second local timing comparator connected to the output of said second filter to receive a filtered analog source signal and generate an event edge when the filtered signal crosses a threshold value, and a second transmission path connecting said second local timing comparator to said time measuring circuit.

* * * * *

UNITED STATES PATENT AND TRADEMARK OFFICE
CERTIFICATE OF CORRECTION

PATENT NO. : 4,792,932.

DATED : December 20, 1988

INVENTOR(S) : William J. Bowhers and Michael R. Ferland

It is certified that error appears in the above-identified patent and that said Letters Patent is hereby corrected as shown below:

Column 2, line 37, before "processing" insert --signal--;

Column 2, line 53, "lock" should be --block--;

Column 2, line 60, "FIG. 2" should be --FIG. 2a--;

Column 4, line 23, "additonal" should be --additional--;

Column 8, line 45, "noes" should be --nodes--;

Column 10, line 1, after "generate" insert --a--; and

Figure 1A:
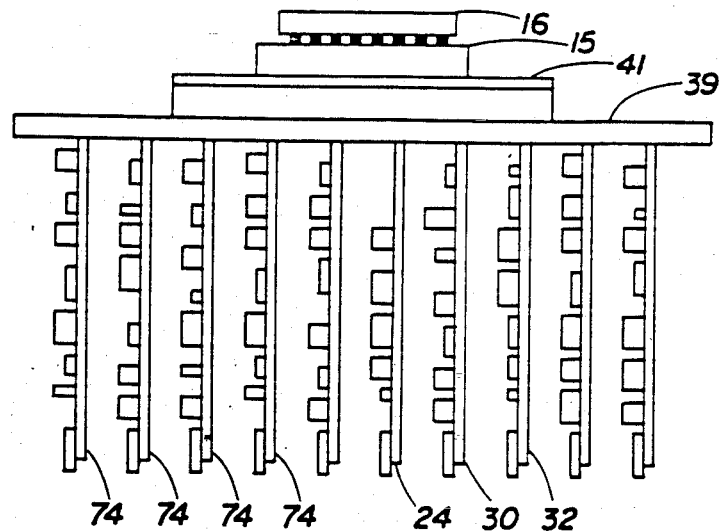
FIG. 1A is a diagrammatic partial elevation showing a connection of channel cards to a fixture for a circuit under test of the FIG. 1 apparatus.

Drawing Sheet 2 of 3 consisting of incorrect Fig. 2 should be deleted and attached Figs. 1a, 2 and 2a should be substituted therefor.

Signed and Sealed this

Twenty-third Day of January, 1990

*Attest:*

JEFFREY M. SAMUELS

*Attesting Officer*     *Acting Commissioner of Patents and Trademarks*